(12) United States Patent
Kim et al.

(10) Patent No.: US 12,729,430 B2
(45) Date of Patent: Sep. 8, 2026

(54) METAL-ON-METAL DEPOSITION METHODS FOR FILLING A GAP FEATURE ON A SUBSTRATE SURFACE

(71) Applicant: ASM IP Holding B.V., Almere (NL)

(72) Inventors: Jiyeon Kim, Tempe, AZ (US); YoungChol Byun, Tempe, AZ (US); Petri Raisanen, Gilbert, AZ (US); Dong Li, Phoenix, AZ (US); Eric James Shero, Phoenix, AZ (US); Yasiel Cabrera, Phoenix, AZ (US); Arul Vigneswar Ravichandran, Tempe, AZ (US); Eric Christopher Stevens, Tempe, AZ (US); Paul Ma, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 490 days.

(21) Appl. No.: 17/989,760

(22) Filed: Nov. 18, 2022

(65) Prior Publication Data

US 2023/0160057 A1 May 25, 2023

Related U.S. Application Data

(60) Provisional application No. 63/282,217, filed on Nov. 23, 2021.

(51) Int. Cl.
*C23C 16/14* (2006.01)
*H10P 14/40* (2026.01)
(Continued)

(52) U.S. Cl.
CPC ............ *C23C 16/14* (2013.01); *H10P 14/412* (2026.01); *H10P 72/0432* (2026.01); *H10W 20/098* (2026.01)

(58) Field of Classification Search
CPC ......... H01L 21/28562; H01L 21/28568; H01L 21/32051; H01L 21/67103;
(Continued)

(56) References Cited

U.S. PATENT DOCUMENTS 4,717,632 A 1/1988 Keem et al.
5,599,740 A 2/1997 Jang et al.
(Continued)

FOREIGN PATENT DOCUMENTS

CN 101308794 A 11/2008
CN 102476919 A 5/2012
(Continued)

OTHER PUBLICATIONS

Juppo, Marika et al., "Deposition of molybdenum thin films by an alternate supply of MoCl 5 and Zn," J. Vac. Sci. Technol. A 16(5), Sep./Oct. 1998; 2845-2850.
(Continued)

*Primary Examiner* — Brook Kebede
(74) *Attorney, Agent, or Firm* — Snell & Wilmer L.L.P.

(57) ABSTRACT

Molybdenum (Mo) metal-on-metal (MoM) deposition methods for providing true bottom-up fill in vias and/or other gap features in device structures. These device structures contain metal at the bottom surface and have dielectric sidewalls. The deposition process provides molybdenum growth only, in some cases, on the metal film/layer to provide a selective process that can be called a metal-on-metal (MoM) process. The Mo MoM deposition process described herein are not limited to thin films (e.g., films less than 50 Å) and can be used to deposit thicker films (e.g., greater than 50 Å in some cases and greater than 200 Å in other useful cases) on metal surfaces while no, or substantially no, deposition is found on dielectric surfaces.

19 Claims, 5 Drawing Sheets

(51) Int. Cl.
*H10P 72/00* (2026.01)
*H10W 20/00* (2026.01)

(58) Field of Classification Search
CPC ............... H01L 21/76837; C23C 16/14; C23C 16/45553; C23C 16/02; C23C 16/0227; C23C 16/04; C23C 16/045; C23C 16/455; C23C 16/45523; C23C 16/45527; C23C 28/00; C23C 28/02; C23C 28/023; C23C 28/32; C23C 28/34; H10P 14/40; H10P 14/412; H10P 14/43; H10P 14/432; H10P 72/00; H10P 72/0432; H10W 20/00; H10W 20/057; H10W 20/098
See application file for complete search history.

(56) References Cited

U.S. PATENT DOCUMENTS 6,057,236 A 5/2000 Clevenger et al.
6,383,566 B1 5/2002 Zagdoun
6,403,209 B1 6/2002 Barton et al.
6,867,086 B1 3/2005 Chen et al.
7,220,451 B2 5/2007 Aaltonen et al.
7,402,517 B2 7/2008 Yonker et al.
8,119,527 B1 2/2012 Anand
8,435,894 B2 5/2013 Chandrashekar et al.
8,507,720 B2 8/2013 Shay
9,607,842 B1 3/2017 Woodruff
9,768,060 B2 9/2017 Shaviv et al.
9,981,286 B2 5/2018 Woodruff et al.
10,056,328 B2 8/2018 Yu et al.
10,109,534 B2 10/2018 Brand et al.
10,396,365 B2 8/2019 Lockett
10,510,590 B2 12/2019 Thombare
10,858,296 B1 12/2020 Myrick
11,043,386 B2 6/2021 Chan
11,056,344 B2 7/2021 Zhu
11,230,764 B2 1/2022 Lehn
11,295,980 B2 4/2022 Zope
11,355,345 B2 6/2022 Jandl et al.
11,393,690 B2 7/2022 Zhu
11,437,271 B2 9/2022 Yang et al.
11,550,369 B2 1/2023 Silvanto et al.
11,581,220 B2 2/2023 Zope et al.
12,119,228 B2 10/2024 Zhu et al.
2003/0082296 A1 5/2003 Elers et al.
2003/0165616 A1 9/2003 Yukinobu et al.
2003/0168001 A1 9/2003 Sneh
2004/0018304 A1 1/2004 Chung et al.
2004/0081833 A1 4/2004 Zagdoun
2005/0082676 A1 4/2005 Andry et al.
2005/0186699 A1 8/2005 Kawase et al.
2006/0216929 A1 9/2006 Park et al.
2006/0223300 A1 10/2006 Simka et al.
2006/0223312 A1 10/2006 Yonker et al.
2006/0264031 A1 11/2006 Xi et al.
2007/0132061 A1 6/2007 Chen et al.
2007/0202678 A1 8/2007 Plombon et al.
2007/0218677 A1 9/2007 Engelhardt
2008/0102621 A1 5/2008 Yoon et al.
2008/0142483 A1 6/2008 Hua et al.
2008/0242097 A1 10/2008 Boescke et al.
2009/0305458 A1 12/2009 Hunks et al.
2010/0121100 A1 5/2010 Shay
2010/0258191 A1 10/2010 Mackie
2012/0009785 A1 1/2012 Chandrashekar et al.
2012/0052681 A1 3/2012 Marsh
2012/0115329 A1 5/2012 Chandrashekar et al.
2012/0164564 A1 6/2012 Amro
2012/0219735 A1 8/2012 Bakker et al.
2013/0088160 A1 4/2013 Chai et al.
2013/0109172 A1 5/2013 Collins et al.
2013/0234148 A1 9/2013 Werkhoven
2014/0017904 A1 1/2014 Gauri et al.
2014/0030889 A1 1/2014 Chen et al.
2014/0094035 A1 4/2014 Ji et al.
2014/0141165 A1 5/2014 Sato et al.
2015/0093891 A1 4/2015 Zope et al.
2015/0099072 A1 4/2015 Takamure
2015/0206828 A1 7/2015 Sakata et al.
2015/0214093 A1 7/2015 Dordi et al.
2015/0262828 A1 9/2015 Brand et al.
2015/0262939 A1 9/2015 Sakata
2015/0270215 A1 9/2015 Peng et al.
2015/0371859 A1 12/2015 Sato et al.
2016/0002786 A1 1/2016 Gatineau et al.
2016/0040289 A1 2/2016 Gatineau et al.
2016/0049373 A1 2/2016 Peng et al.
2016/0079054 A1 3/2016 Chen et al.
2016/0126104 A1 5/2016 Shaviv et al.
2016/0204436 A1 7/2016 Barker et al.
2016/0348234 A1 12/2016 Suzuki et al.
2016/0351401 A1 12/2016 Ba et al.
2016/0362784 A1 12/2016 Isobe et al.
2016/0372365 A1 12/2016 Tang et al.
2017/0037513 A1 2/2017 Haukka et al.
2017/0040214 A1 2/2017 Lai et al.
2017/0062224 A1 3/2017 Fu
2017/0117181 A1 4/2017 Adusumilli et al.
2017/0154895 A1 6/2017 Huo
2017/0175290 A1 6/2017 Chen et al.
2017/0222008 A1 8/2017 Hsu et al.
2017/0352550 A1 12/2017 Tois et al.
2017/0356083 A1 12/2017 Anthis et al.
2017/0358482 A1 12/2017 Chen et al.
2018/0019165 A1 1/2018 Baum et al.
2018/0053660 A1* 2/2018 Jandl ..................... C23C 16/045
2018/0142345 A1 5/2018 Meng et al.
2018/0204768 A1 7/2018 Nakatani
2018/0286668 A1 10/2018 Baum et al.
2018/0294187 A1 10/2018 Thombare et al.
2018/0294197 A1 10/2018 Plano
2018/0312966 A1 11/2018 Chan et al.
2019/0067003 A1* 2/2019 Zope ................... H01L 21/0228
2019/0067014 A1* 2/2019 Shrestha ................. C23C 16/14
2019/0067016 A1 2/2019 Zhu et al.
2019/0067094 A1 2/2019 Zope et al.
2019/0067095 A1 2/2019 Zhu et al.
2019/0088555 A1 3/2019 Xie et al.
2019/0103278 A1 4/2019 Hung et al.
2020/0283894 A1 9/2020 Lehn et al.
2020/0303195 A1 9/2020 Tapily
2021/0054500 A1 2/2021 Zope
2021/0090948 A1 3/2021 Chen
2021/0125832 A1 4/2021 Bhatnagar
2021/0151352 A1 5/2021 Zope
2021/0233772 A1 7/2021 Zhu
2021/0238736 A1 8/2021 Butail
2021/0313182 A1 10/2021 Zhu
2021/0313183 A1 10/2021 Ba
2021/0335615 A1 10/2021 Pierreux
2021/0375591 A1 12/2021 Chandrashekar
2021/0407809 A1 12/2021 Zope
2022/0013365 A1 1/2022 Van Cleemput
2022/0018016 A1 1/2022 Ma
2022/0018025 A1 1/2022 Ma
2022/0108916 A1 4/2022 Yang
2022/0165852 A1 5/2022 Gandikota
2022/0195598 A1 6/2022 Collins et al.
2022/0216105 A1 7/2022 Zope
2022/0220139 A1 7/2022 Leoncini et al.
2022/0220140 A1* 7/2022 Leoncini ............... C23C 16/405
2022/0278108 A1 9/2022 Yang
2022/0290300 A1 9/2022 Vellanki
2022/0298624 A1 9/2022 Blakeney et al.
2022/0328317 A1* 10/2022 Na ................... C23C 16/45553
2022/0328318 A1 10/2022 Zhu
2023/0295795 A1 9/2023 Cabrera et al.

(56) References Cited

U.S. PATENT DOCUMENTS

| | | | |
|---|---|---|---|
| 2023/0298902 | A1 | 9/2023 | Kim et al. |
| 2023/0349040 | A1 | 11/2023 | Mousa et al. |

FOREIGN PATENT DOCUMENTS

| | | | |
|---|---|---|---|
| CN | 102712583 | B | 4/2015 |
| CN | 105470193 | A | 4/2016 |
| CN | 108389798 | A | 8/2018 |
| CN | 109427570 | A | 3/2019 |
| CN | 113166929 | A | 7/2021 |
| JP | S6314870 | A | 1/1988 |
| JP | 02025568 | A | 1/1990 |
| JP | H02170536 | A | 7/1990 |
| JP | 06208967 | A | 7/1994 |
| JP | H07106585 | A | 4/1995 |
| JP | 2006228923 | A | 8/2006 |
| JP | 2008108875 | A | 5/2008 |
| JP | 2009024252 | A | 2/2009 |
| JP | 2016098406 | A | 5/2016 |
| JP | 2020029616 | A | 2/2020 |
| JP | 2020029617 | A | 2/2020 |
| JP | 2020029618 | A | 2/2020 |
| KR | 20000059312 | A | 10/2000 |
| KR | 20060032375 | A | 4/2006 |
| KR | 20080114228 | A | 12/2008 |
| KR | 20120005992 | A | 1/2012 |
| KR | 101179443 | B1 | 9/2012 |
| KR | 102299665 | B1 | 9/2021 |
| KR | 20220155951 | A | 11/2022 |
| TW | 201934792 | A | 9/2019 |
| WO | 2004000827 | A1 | 12/2003 |
| WO | 2014013214 | A1 | 1/2014 |
| WO | 2018191183 | A1 | 10/2018 |
| WO | 2021035254 | A1 | 2/2021 |
| WO | 2021046058 | A1 | 3/2021 |
| WO | 2021076636 | A1 | 4/2021 |
| WO | 2021167958 | A1 | 8/2021 |

OTHER PUBLICATIONS

Bhave, Mandar, et al., "Developer-soluble Gap fill materials for patterning metal trenches in Via-first Dual Damascene process". Proc. SPIE 5376, Advances in Resist Technology and Processing XXI, (May 14, 2004); pp. 640-647.

Lee, Baek-Ju, et al., "A Study on the Gap-Fill Process Deposited by the Deposition/Etch/Deposition Method in the Space-Divided PE-ALD System". Coatings 2023, 13, 48, pp. 1-13.

Ramasamy, Karthik, etal., "Selective Deposition of Cobalt Sulfide Nanostructured Thin Films from Single-Source Precursors". Chemistry of Materials, 2010, 22, 4919-4930.

Dasgupta, Neil P., et al., "Atomic Layer Deposition of Metal Sulfide Materials". Accounts of Chemical Research, 2015, 48, 341-348.

Mackus, Adriaan, et al., "From the Bottom-Up: Toward Area-Selective Atomic Layer Deposition with High Selectivity". Chemistry of Materials, 2019, 31,2-12.

Singh, Joseph A., et al., "Area-Selective Atomic Layer Deposition of Metal Oxides on Noble Metals through Catalytic Oxygen U Activation". Chemistry of Materials 2018, 30, 663-670.

Lemaire, Paul C., et al., "Understanding inherent substrate selectivity during atomic layer deposition: Effect of surface preparation, hydroxyl density, and metal oxide composition on nucleation mechanisms during tungsten ALD". The Journal of Chemical U Physics 146, 052811 (2017) pp. 1-9.

* cited by examiner

METAL-ON-METAL DEPOSITION METHODS FOR FILLING A GAP FEATURE ON A SUBSTRATE SURFACE

CROSS-REFERENCE TO RELATED APPLICATIONS

This application is a nonprovisional of, and claims priority to and the benefit of, U.S. Provisional Patent Application No. 63/282,217, filed Nov. 23, 2021 and entitled "METAL-ON-METAL DEPOSITION METHODS FOR FILLING A GAP FEATURE ON A SUBSTRATE SURFACE," which is hereby incorporated by reference herein.

FIELD OF INVENTION

The present disclosure relates generally to methods for filling a gap feature on a substrate surface and particularly to methods for filling one or more gap features with a molybdenum (Mo) metal film utilizing Mo metal-on-metal (MoM) selective bottom-up fill deposition processes. The present disclosure also generally relates to semiconductor device structures including one or more gap features filled with a molybdenum metal film.

BACKGROUND OF THE DISCLOSURE

Semiconductor fabrication processes for forming semiconductor device structures, for example, transistors, memory elements, and integrated circuits, are wide ranging and may include deposition processes, etch processes, thermal annealing processes, lithography processes, and doping processes, amongst others.

A particular semiconductor fabrication process commonly utilized is the deposition of a metal film into a gap feature thereby filling the gap feature (which may include a gap, a trench, a via, and the like) with the metal film, a process commonly referred to as "gap fill." Substrates used during the manufacture of semiconductor devices may comprise a multitude of gap features on a substrate with a non-planar surface. The gap features may comprise substantially vertical gap features being disposed between protruding portions of the substrate surface or indentations formed in a substrate surface. The gap features may also comprise substantially horizontal gap features being disposed between two adjacent materials bounding the horizontal gap feature. As semiconductor device structure geometries have decreased and high aspect ratio features have become more common place in such semiconductor device structures as DRAM, flash memory, and logic, it has become increasingly difficult to fill the multitude of gap features with a metal having the desired characteristics.

Deposition methods such as high density plasma (HDP), sub-atmospheric chemical vapor deposition (SACVD), and low pressure chemical vapor deposition (LPCVD) have been used for gap fill processes, but these processes commonly do not achieve the desired gap fill capability.

Accordingly, methods and associated semiconductor device structures are desired for filling gap features on a non-planar substrate with a gap fill metal with improved characteristics.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In some cases, the Mo MoM deposition methods described herein enable true bottom-up fill in vias and/or other gap features in device structures (or, more simply, "substrates"). These device structures contain metal at the bottom surface and dielectric sidewalls. The deposition process has been shown in testing to provide molybdenum growth only, in some cases, on the metal film/layer to provide a selective process that can be called a metal-on-metal (MoM) process. The Mo MoM deposition process described herein are not limited to thin films (e.g., films less than 50 Å) but can be used to deposit thicker films (e.g., greater than 50 Å in some cases and greater than 200 Å in other useful cases) on metal surfaces while no deposition is found on dielectric surfaces.

According to some aspects of this description, a method is provided for filling a gap feature on a substrate surface. The method may include, as an initial step, surface cleaning a substrate with a surface comprising a gap feature to remove metal oxides. Then, the method may include providing the substrate in a reaction chamber (the same or a different one than used for the surface cleaning), and the gap feature includes a dielectric sidewall and a metal base (or metal film or layer on a bottom surface of the gap feature, which may be a via, a gap, a trench, or the like). The method also includes partially filling the gap feature with a molybdenum film with a cyclical deposition process. In each unit cycle, the molybdenum film is selectively deposited on the metal base. Each cycle of the cyclical deposition process may include: (a) providing a molybdenum precursor in the reaction chamber; and (b) providing a reactant in the reaction chamber to form a layer of the molybdenum film, with purging provided after one or both of these providing steps. The method then includes repeating the partially filling the gap step until the molybdenum film has at least a predefined thickness.

The method may be performed where the metal base comprises a metal selected from the group consisting of tungsten (W), titanium nitride (TiN), ruthenium (Ru), cobalt (Co), and copper (Cu). To this end, the reactant is a reducing agent, such as one including hydrogen.

The molybdenum precursor is or includes molybdenum chloride ($MoCl_5$) or other $MoCl_x$ such as $MoCl_4$. In such cases, the method may include, prior to the providing steps, heating the substrate to a substrate temperature in the range of 350 to 550° C. and then may include maintaining the reaction chamber at a pressure in the range of 10 to 100 Torr during the partially filling the gap step.

In other implementations of the method, the molybdenum precursor is or includes molybdenum dichloride dioxide ($MoO_2Cl_2$) or molybdenum oxytetrachloride ($MoOCl_4$). In such cases, the method may include heating the substrate to a substrate temperature in the range of 350 to 450° C. and maintaining the reaction chamber at a pressure in the range of 10 to 100 Torr during the partially filling the gap step.

In some embodiments of the method, the predefined thickness is greater than 50 Å, and the molybdenum film selectively grows on the metal film relative to the dielectric sidewall for at least the predefined thickness. In some useful cases, the predefined thickness is greater than 200 Å while other implementations may achieve a thickness in the range of 20 to 600 Å. The method may be used to fabricate a semiconductor device structure including one or more gap features filled with a molybdenum film by this new cyclical deposition method involving selective bottom-up gap fill.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

DETAILED DESCRIPTION OF EXEMPLARY EMBODIMENTS

Figure 1:
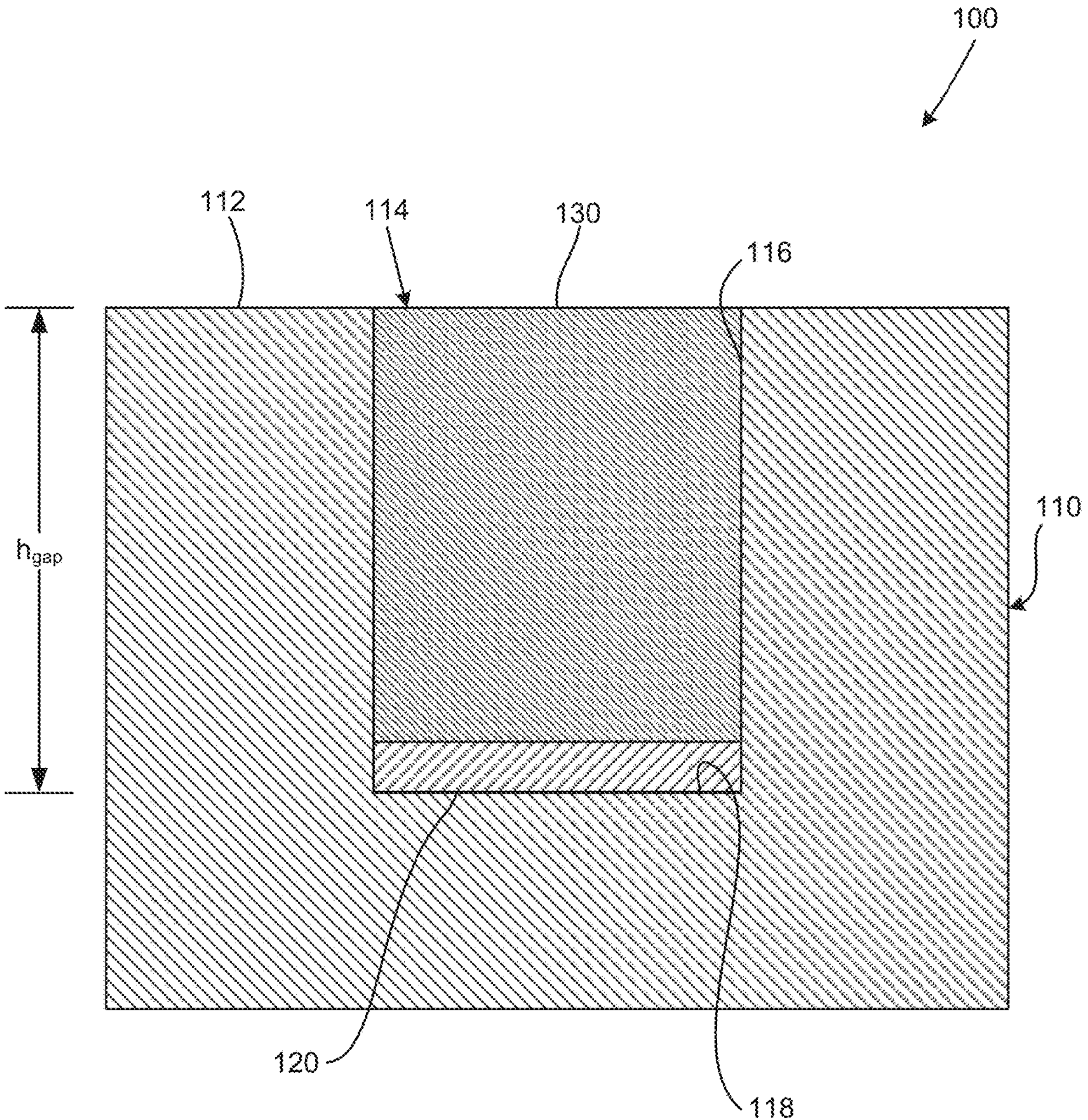
FIG. 1 illustrates a cross-sectional schematic diagram of a semiconductor device structure or substrate that includes a molybdenum metal film or fill element disposed in and filling (MoM filling) a gap feature according to embodiments of the disclosure.

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The illustrations presented herein are not meant to be actual views of any particular material, structure, or device, but are merely idealized representations that are used to describe embodiments of the disclosure.

As used herein, the term "substrate" may refer to any underlying material or materials that may be used, or upon which, a device or device structure, a circuit, or a film may be formed.

As used herein, the term "cyclic deposition" may refer to the sequential introduction of one or more precursors and/or reactants into a reaction chamber to deposit a film over a substrate and includes deposition techniques such as atomic layer deposition and cyclical chemical vapor deposition.

As used herein, the term "cyclical chemical vapor deposition" may refer to any process wherein a substrate is sequentially exposed to one or more volatile precursors, which react and/or decompose on a substrate to produce a desired deposition.

As used herein, the term "atomic layer deposition" (ALD) may refer to a vapor deposition process in which deposition cycles, preferably a plurality of consecutive deposition cycles, are conducted in a reaction chamber. Typically, during each cycle the precursor is chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, if necessary, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term "atomic layer deposition," as used herein, is also meant to include processes designated by related terms such as, "chemical vapor atomic layer deposition," "atomic layer epitaxy" (ALE), molecular beam epitaxy (MBE), gas source MBE, or organometallic MBE, and chemical beam epitaxy when performed with alternating pulses of precursor composition(s), reactive gas, and purge (e.g., inert carrier) gas.

As used herein, the term "film" and "thin film" may refer to any continuous or non-continuous structures and material formed by the methods disclosed herein. For example, "film" and "thin film" could include 2D materials, nanolaminates, nanorods, nanotubes, or nanoparticles, or even partial or full molecular layers, or partial or full atomic layers or clusters of atoms and/or molecules. "Film" and "thin film" may comprise material or a layer with pinholes, but still be at least partially continuous.

As used herein, the term "gap feature" may refer to an opening or cavity disposed between two surfaces of a substrate. The term "gap feature" may refer to an opening or cavity disposed between opposing inclined sidewalls of two protrusions, such as gaps, vias, trenches, and the like, extending vertically from the surface of the substrate or opposing inclined sidewalls of an indentation extending vertically into the surface of the substrate, such a gap feature may be referred to as a "vertical gap feature." The term "gap feature" may also refer to an opening or cavity disposed between two opposing substantially horizontal surfaces, the horizontal surfaces bounding the horizontal opening or cavity; such a gap feature may be referred to as a "horizontal gap feature."

A number of example materials are given throughout the embodiments of the current disclosure, it should be noted that the chemical formulas given for each of the example materials should not be construed as limiting and that the non-limiting example materials given should not be limited by a given example stoichiometry.

The present disclosure includes methods for filling one or more gap features on a substrate surface and particularly methods for filling one or more gap features with a molybdenum metal film utilizing a cyclical deposition-etch process. Molybdenum metal thin films may be utilized in a number of applications, such as, for example, low electrical resistivity gap-fill, liner layers for 3D-NAND, DRAM word-line features, or as an interconnect material in CMOS logic applications. The ability to deposit a molybdenum metal film in a gap feature may allow for lower effective electrical resistivity for interconnects in logic applications, i.e., CMOS structures, and word-line/bit-line in memory applications, such as 3D-NAND and DRAM structures.

The inventors recognized that a common solution for Middle-Of-Line (MOL) via fill applications is to process a substrate using gap-fill techniques, but these can be problematic as they can require over one hundred percent step coverage and result in a seam that can diminish device properties. Some area selective deposition processes have been developed but are limited to thin layers (e.g., ones significantly less than 50 angstroms (Å)) after which the processes are no longer selective as growth occurs on dielectric surfaces and/or involve use of very narrow process windows. With these and other issues in mind, a deposition process is presented that is useful for achieving highly selective molybdenum metal-on-metal (or Mo MoM) deposition. For example, the selectivity may be greater than 20 Å, greater than 50 Å, or greater than 200 Å for deposition on metal (e.g., a metal film on a bottom surface (or "metal base") of a gap feature such as the bottom surface, surface, or base of a via, a trench, a gap, a pattern, or the like) versus on a nearby or adjacent dielectric (e.g., a dielectric sidewall or side surface of a gap feature).

In brief, a deposition process is described herein for filling a gap feature on a substrate surface. In some embodiments, the deposition process is designed to provide a selective bottom-up fill of the gap feature and, more particularly, a Mo MoM selective bottom-up fill of the gap feature. In some embodiments of the disclosure, molybdenum metal films or fill elements formed by the methods disclosed herein may be utilized to fill one or more vertical gap features and/or one or more horizontal gap features. For example, FIG. 1 illustrates a semiconductor device structure 100 that includes a substrate 110 with an upper surface 112 with a vertical high aspect ratio gap feature 114 (with it being understood that the deposition process would work similarly with horizontal gap features). The feature 114 may have an aspect ratio (height:width) greater than 2:1, or greater than 5:1, or greater than 10:1, or greater than 25:1, or greater than 50:1, greater than 100:1, or even greater than 200:1, where "greater than" in this particular example refers to a greater distance in the height of the gap feature 114.

The gap feature 114 has vertical sidewalls 116 formed of a dielectric material (e.g., an oxide that may be represented as 1kOx). In some embodiments, the sidewalls 116 may include dielectric materials, such as, but not limited, silicon containing dielectric materials and metal oxide dielectric materials. In some embodiments, the dielectric surfaces 116 may include a silicon containing dielectric material such as, but not limited to, silicon dioxide (SiO2), silicon sub-oxides, silicon nitride (Si3N4), silicon oxynitride (SiON), silicon oxycarbide (SiOC), silicon oxycarbide nitride (SiOCN), silicon carbon nitride (SiCN). In some embodiments, the substrate 110 or at least its sidewalls 116 may include one or more dielectric surfaces comprising a metal oxide such as, but not limited to, aluminum oxide (Al2O3), hafnium oxide (HfO2), tantalum oxide (Ta2O5), zirconium oxide (ZrO2), titanium oxide (TiO2), hafnium silicate (HfSiOx), and lanthanum oxide (La2O3).

The gap feature 114 further includes a bottom surface/side or base 118, and the structure 100 includes a metal layer or film 120 on this bottom surface/side or base 118. The metal film 120 may include a wide variety of metals to practice the deposition method including titanium nitride (TiN), tungsten (W), ruthenium (Ru), cobalt (Co), and copper (Cu). The deposition methods disclosed herein may be utilized to form a molybdenum metal film or fill element 130 (e.g., a Mo film or Mo fill element) directly over the metal layer or film 120 on the base 118 of the gap feature 114 in a selective MoM bottom-fill manner.

The deposition is "selective" in that the molybdenum grows selectively upon the metal film 120 and not on the dielectric sidewalls 116 (e.g., with a 50:1 or greater ratio between deposition on metal film 120 and on the dielectric sidewalls 116 or surface 112, in some cases, which may also be dielectric). The selectivity achieved with the deposition methods described in detail below is such that the fill element 130 can have a height or thickness matching or exceeding a height, hgap, of the gap feature 114. In some embodiments of the disclosure, the molybdenum metal films formed may have a thickness from about 20 Å to about 250 Å. In some embodiments, the molybdenum metal films formed according to some of the embodiments described herein may have a thickness greater than about 20 Å, or greater than about 50 Å, or greater than about 250 Å, or greater than about 500 Å.

As a non-limiting example, the semiconductor device structure 100 may represent a partially fabricated CMOS logic device with the substrate 110 being an interlayer dielectric and the molybdenum metal film 130 may be a metal gap-fill for providing electrical connection to one or more transistor structures (not shown). In some embodiments, the molybdenum metal film may be utilized as a gap-fill metallization, and the molybdenum metal film may fill the gap features, i.e., a vertical high aspect ratio gap feature.

Figure 2:
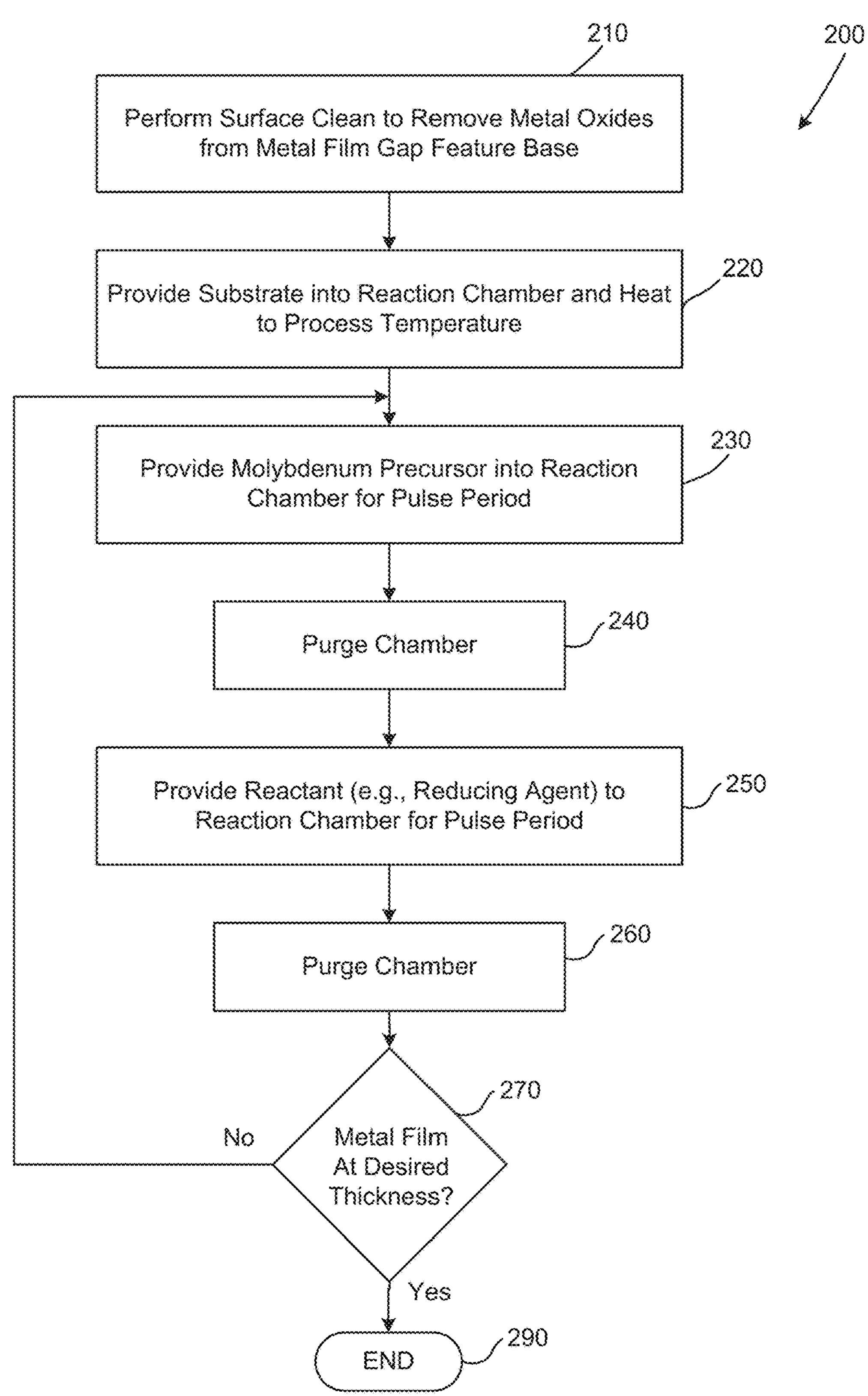
FIG. 2 illustrates a non-limiting exemplary process flow for a method for selective bottom-up filling of one or more gap features on a surface of a substrate with a molybdenum metal film according to the present description.
Figure 3:
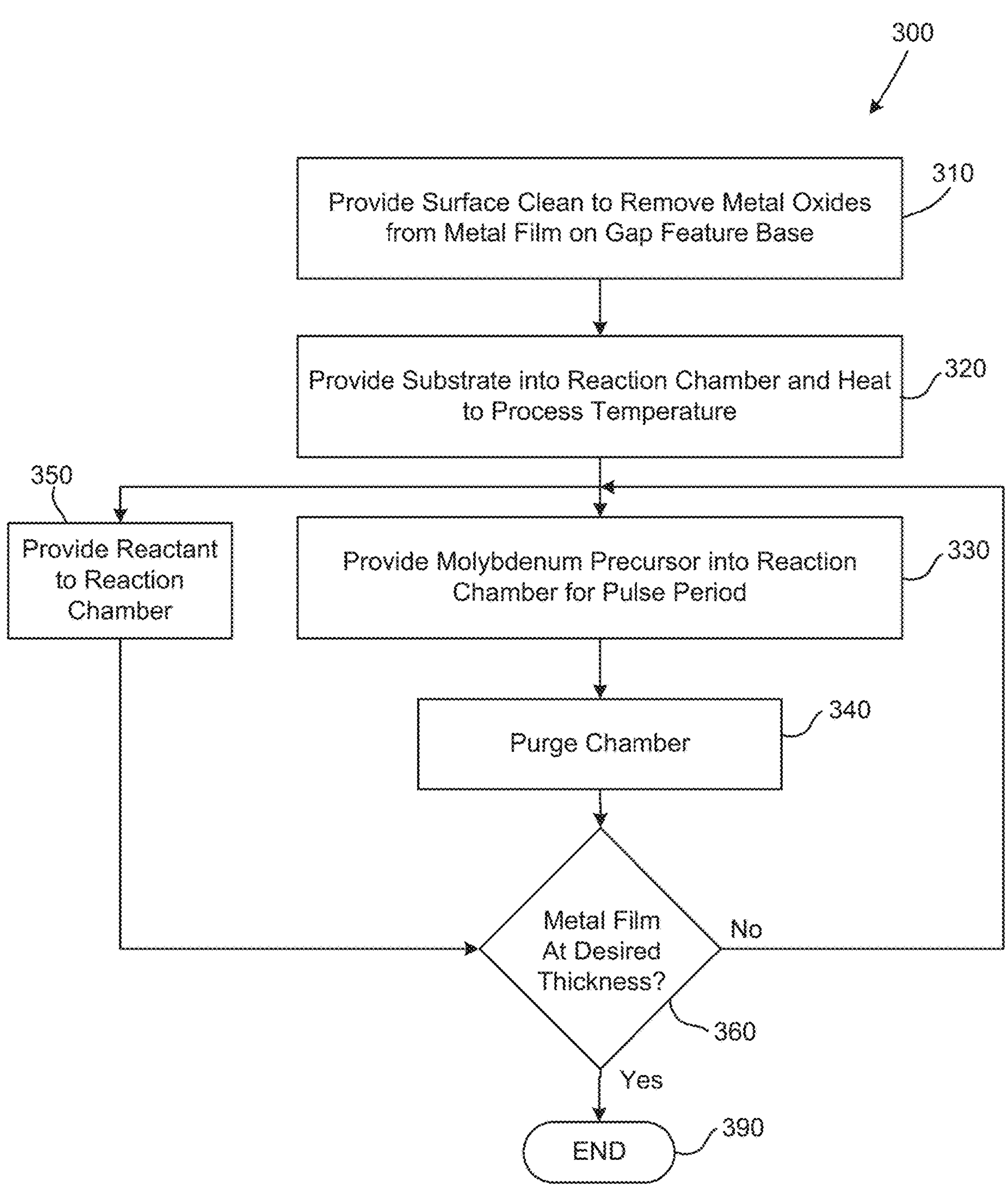
FIG. 3 illustrates another non-limiting exemplary process flow for a method for selective bottom-up filling of one or more gap features on a surface of a substrate with a molybdenum metal film according to the present description.

To fabricate the device structure 100, a "bottom-up" fill process is described for via and other gap feature fill applications. These structures generally contain metal films/layers at the bottom surface of the gap feature and dielectric sidewalls. The new process, such as those described in methods 200 and 300 and with reference to FIGS. 2 and 3, provides molybdenum growth only (or substantially only due to achieved selectivity between metal and dielectric surfaces) on the surfaces of the metal films/layers. This type of selective process is called a metal-on-metal (MoM) process and since molybdenum (Mo) is being grown, a selective Mo MoM bottom-up fill, and this process has been shown through testing to be useful for relatively thick Mo films or fills of gap features such as for thicknesses of more than 20 Å, more than 50 Å, more than 200 Å, and even from 20 to 500 Å or more with no deposition on the dielectric surfaces of the sidewalls of the gap feature.

FIG. 2 illustrates a non-limiting exemplary process flow for the method 200 for selective bottom-up filling of one or more gap features on a surface of a substrate of a device structure (such as structure 100 of FIG. 1) with a molybdenum metal film according to one embodiment of the present description. The method 200 may begin with step 210 that involves performing a surface clean on a semiconductor device structure to remove metal oxides from a metal film/layer/element on a bottom surface(s) or a base(s) of a gap feature(s). The metal film may be formed of or include a variety of metals including, but not limited to, titanium nitride (TiN), tungsten (W) (such as fluorine-free W (FFW)), ruthenium (Ru), cobalt (Co), and copper (Cu). Before depositing Mo on the metal surfaces of the device structure, it is typically useful to remove metal oxides on the substrate, and surface cleaning of step 210 may be performed, for example, using H2-based plasma cleaning techniques in a direct plasma or a remote plasma tool that are designed to remove metal oxides.

Once the metal oxides are removed, the method 200 may continue with step 220 involving providing the device structure (or substrate, wafer, or the like) into a reaction chamber designed for cyclical deposition and then heating the device structure to a desired process temperature. Next, steps 230 to 260 may be performed to perform a cycle of a cyclical deposition process (such as ALD, CVD, or the like) to partially fill the gap feature with a Mo film on the metal film/layer (e.g., metal film 120) on the base or bottom surface of the gap feature, and the cycle may be repeated as needed to provide a desired fill of a gap feature (e.g., a desired Mo layer or fill element thickness).

The cycle in method 200 may be considered to have a sequence of a Mo pulse, purge, a reactant (e.g., a reducing agent such as H2) pulse, and a purge. This is shown in FIG. 2 with step 230 providing a molybdenum precursor into the reaction chamber for a pulse period. The molybdenum precursor may take a variety of forms with molybdenum chloride (MoCl5) or a MoCl5 precursor being useful in some implementations of method 200. The pulse may be carried out for a time period in the range of 1 to 10 seconds, with 1 second used in one embodiment. Step 240 involves purging the Mo from the reaction chamber, which may be carried out with flow of an inert gas for a purge period in the range of 1 to 30 seconds, with 5 seconds being used in one embodiment.

The cycle continues with step 250 involving providing a reactant to the reaction chamber for a pulse period. The reactant may take a variety of forms to implement the method 200 with a reducing agent such as H2 used in some implementations. The pulse period may be in the rage of 1 to 45 seconds, with 10 seconds used in one exemplary embodiment. The deposition cycle continues at 260 with a purge of the reactant from the reaction chamber (e.g., a H2 purge) that may be performed for 1 to 30 seconds, with a 15 second purge used in one exemplary embodiment. Then, at step 270, if the Mo film has not reached the desired thickness, then additional cycle may be performed to further increase the thickness for the Mo film being grown to bottom-up fill the gap feature, with no or very limited deposition on the dielectric surfaces of the gap feature sidewalls (relevant oxide surfaces, such as low-k, tetraethyl orthosilicate (TEOS) oxide, silicon nitride (SiN), and other surfaces of the device structure). If further thickness is desired, an additional cycle is performed by repeating steps 230 to 260. If the desired film or fill element thickness is satisfied, the method 200 may end at 290.

The cycle steps 230-260 may be varied to implement the method 200 on differing tools, such as differing ALD platforms or tools. With this in mind, the above operating or deposition parameters were provided for one tool (e.g., one specific ALD tool). These may be modified for another cyclical deposition tool (e.g., a second ALD tool). For example, the Mo pulse (step 230) may have the range of 0.05 to 10 seconds, with 2 seconds used in one use case. The Mo purge (step 240) may be in the range of 0.5 to 30 seconds, with 5 seconds used in one use case. The H2 pulse (step 250) may be in the range of 1 to 45 seconds, with 10 seconds used in one use case, and the H2 purge (step 260) may be in the range of 0.5 to 30 seconds, with 5 seconds used in one case. Hence, considering at least these two examples, the precursor pulse may be in the range of 0.05 to 10 seconds, the precursor purge may be in the range of 0.5 to 30 seconds, the reactant pulse may be in the range of 1 to 45 seconds, and the reactant purge may be in the range of 0.5 to 30 seconds.

Reactors or reaction chambers capable of being used to fill one or more gap features with a molybdenum metal film grown on metal surfaces may be configured for performing a cyclic deposition process, and the deposition stages of the process may include a cyclic deposition process, such as, atomic layer deposition (ALD) or cyclical chemical vapor deposition (CVD). Reactors or reaction chambers suitable for performing the embodiments of the disclosure may include ALD reactors, as well as CVD reactors, configured to provide the precursors, reactants, and purge gases. According to some embodiments, a showerhead reactor may be used. According to some embodiments, cross-flow, batch, minibatch, or spatial ALD reactors may be used.

In some embodiments of the disclosure, a batch reactor may be used. In some embodiments, a vertical batch reactor may be used. In other embodiments, a batch reactor comprises a minibatch reactor configured to accommodate 10 or fewer wafers, 8 or fewer wafers, 6 or fewer wafers, 4 or fewer wafers, or 2 or fewer wafers. In some embodiments in which a batch reactor is used, wafer-to-wafer non-uniformity is less than 3% (1 sigma), less than 2%, less than 1%, or even less than 0.5%.

The exemplary selective bottom-up Mo MoM fill processes as described herein may optionally be carried out in a reactor or reaction chamber connected to a cluster tool. In a cluster tool, because each reaction chamber is dedicated to one type of process, the temperature of the reaction chamber in each module can be kept constant, which improves the throughput compared to a reactor in which the substrate is heated up to the process temperature before each run. Additionally, in a cluster tool it is possible to reduce the time to pump the reaction chamber to the desired process pressure levels between substrates. In some embodiments of the disclosure, the exemplary Mo MoM processes disclosed herein may be performed in a cluster tool including multiple reaction chambers, where each individual reaction chamber may be utilized to expose the substrate to an individual precursor gas and the substrate may be transferred between different reaction chambers for exposure to multiple precursor and/or reactant gases, the transfer of the substrate being performed under a controlled ambient to prevent oxidation/contamination of the substrate. In some embodiments of the disclosure, the molybdenum metal film deposition processes of the current disclosure may be performed in a cluster tool including multiple reaction chambers, wherein each individual reaction chamber may be configured to heat the substrate to a different temperature. In some embodiments, the gap fill processes of the current disclosure may be performed in a single stand-alone reactor which may be equipped with a load-lock. In that case, it is not necessary to cool down the reaction chamber between each run.

Once the device structure or substrate is disposed within a suitable reaction chamber, such as, an atomic layer deposition reaction chamber or a chemical vapor deposition reaction chamber, the structure or substrate may be heated to a desired process temperature. In some embodiments, the cyclical deposition phase (e.g., steps 230 to 260 of exemplary method 200) may be performed at a constant substrate temperature. In alternative embodiments, the structure or substrate may be heated to a differing temperatures for differing ones of the steps of each cycle. In some embodiments of the disclosure, the structure or substrate may be heated to a temperature (sometimes labeled "wafer temperature") of less than approximately 550° C., or less than approximately 450° C., or less than approximately 400° C. or to a temperature in the range of 350 to 550° C. Some embodiments, such as for the deposition results shown in FIG. 4 for use of the method 200, were carried out at wafer temperatures in the range of 350 to 500° C. to retain desired selectivity of Mo deposition on metal versus dielectric surfaces.

In addition, to achieving a desired process temperature, i.e., a desired wafer temperature, the bottom-up Mo MoM fill method 200 may also be performed so as to regulate the pressure within the reaction chamber during the gap fill process (or at least during cycle steps 230 to 260) to obtain desirable characteristics of the gap fill and the molybdenum metal film disposed within the one or more gap features. For example, in some embodiments of the disclosure, each deposition cycle may be performed within a reaction chamber regulated to a reaction chamber pressure of less than 100 Torr, or less than 60 Torr, or less than 50 Torr. In some embodiments, the pressure within the reaction chamber during the exemplary gap fill method 200 may be regulated at a pressure between 10 and 100 Torr, such as at 40 Torr, at 60 Torr, or other pressure within this range.

A non-limiting example embodiment of a cyclical deposition process may include atomic layer deposition (ALD), wherein ALD is based on typically self-limiting reactions, whereby sequential and alternating pulses of reactants are used to deposit about one atomic (or molecular) monolayer of material per deposition cycle. The deposition conditions and precursor, reactant, and purge gases are typically selected to provide self-saturating reactions, such that an absorbed layer of one reactant leaves a surface termination that is non-reactive with the gas phase reactants of the same reactants. The substrate is subsequently contacted with a different reactant that reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example, if some gas phase reactions occur despite the alternating nature of the process.

In an ALD-type process utilized for partially filling one or more gap features with a molybdenum metal film, a unit deposition cycle may comprise exposing the substrate to a vapor phase precursor, removing any unreacted first vapor phase precursor and reaction byproducts from the reaction chamber, and exposing the substrate to a vapor phase reactant, followed by a second removal or purge step. In some embodiments of the disclosure, the vapor phase reactant may comprise a molybdenum precursor and the vapor phase reactant may comprise a reducing agent precursor.

Reactants and/or precursors may be separated by inert gases, such as argon (Ar) or nitrogen (N2), to prevent gas-phase reactions between reactants and enable self-saturating surface reactions. In some embodiments, the inert gas used to prevent gas-phase reactants may consist of argon (Ar), wherein argon may be utilized to prevent nitridization of the surfaces of the one or more gap features. In some embodiments, however, the substrate may be moved to separately contact a vapor phase precursor and a vapor phase reactant. Because the reactions self-saturate, strict temperature control of the substrates and precise dosage control of the precursors may not be required. However, the substrate temperature is preferably such that an incident gas species does not condense into monolayers nor decompose on the surface. Surplus chemicals and reaction byproducts, if any, are removed from the substrate surface, such as by purging the reaction space or by moving the substrate before the substrate is contacted with the next reactive chemical. Undesired gaseous molecules can be effectively expelled from a reaction space with the help of an inert purging gas. A vacuum pump may be used to assist in the purging.

According to some non-limiting embodiments of the disclosure, the process blocks 230 to 260 of FIG. 2 may involve an ALD process that is utilized to partially fill the one or more gap features with a molybdenum metal film on a metal base of the gap features. In some embodiments of the disclosure, a unit ALD cycle may include two distinct deposition steps or stages. In a first stage of the deposition cycle ("the molybdenum stage"), the substrate surface on which deposition is desired may be contacted with a vapor phase precursor such as a molybdenum precursor which chemisorbs on to the surface of the substrate forming no more than about one monolayer on the surface of the substrate. In a second stage of the deposition, the substrate surface on which deposition is desired may be contacted with a vapor phase reactant including a reducing agent precursor ("the reducing stage").

During the contacting of the substrate with the molybdenum precursor, the flow rate of the molybdenum precursor may be less than 1000 sccm, or less than 500 sccm, or less than 100 sccm, or less than 10 sccm, or even less than 1 sccm. In addition, during the contacting of substrate with the molybdenum precursor, the flow rate of the molybdenum precursor may range from about 1 to 2000 sccm, from about 5 to 1000 sccm, or from about 10 to about 500 sccm. Upon purging the reaction chamber with a purge cycle (step 240 in FIG. 2), the exemplary atomic layer deposition cycle may continue with a second stage of the cyclical deposition by contacting the substrate with a vapor phase reactant that may include a reducing agent precursor ("the reducing precursor"). In particular embodiments of the disclosure, the reducing agent precursor may include molecular hydrogen (H2). During the contacting of the substrate with the reducing agent precursor substrate, the flow rate of the reducing agent precursor may be less than 30 slm, or less than 15 slm, or less than 10 slm, or less than 5 slm, or less than 1 slm, or even less than 0.1 slm. In addition, during the contacting of the substrate with the reducing agent precursor to the substrate the flow rate of the reducing agent precursor may range from about 0.1 to 30 slm, from about 5 to 15 slm, or equal to or greater than 10 slm. After the contacting of the substrate with the reducing agent precursor, the exemplary deposition cycle for at least partially filing one or more gap features with a molybdenum metal film on a gap feature's metal base may proceed by purging the reaction chamber (step 260). For example, excess reducing agent precursor and reaction byproducts (if any) may be removed from the surface of the substrate, e.g., by pumping whilst flowing an inert gas.

It should be appreciated that in some embodiments of the disclosure, the order of contacting of the substrate with the molybdenum precursor and the vapor phase reactant (e.g., the reducing precursor) may be such that the substrate is first contacted with the vapor phase reactant followed by the molybdenum precursor. In addition, in some embodiments, the cyclical deposition phase may involve contacting the substrate with the molybdenum precursor one or more times prior to contacting the substrate with the vapor phase reactant one or more times. In addition, in some embodiments, the cyclical deposition phase may involve contacting the substrate with the vapor phase reactant one or more times prior to contacting the substrate with the molybdenum precursor one or more times.

In some embodiments the cyclical deposition process utilized for partially filling the one or more gap features may be a hybrid ALD/CVD or a cyclical CVD process. For example, in some embodiments, the growth rate of the ALD process may be low compared with a CVD process. One approach to increase the growth rate may be that of operating at a higher substrate temperature than that typically employed in an ALD process, resulting in some portion of a chemical vapor deposition process, but still taking advantage of the sequential introduction of precursors, such a process may be referred to as cyclical CVD. In some embodiments, a cyclical CVD process may comprise the introduction of two or more precursors into the reaction chamber wherein there may be a time period of overlap between the two or more precursors in the reaction chamber resulting in both an ALD component of the deposition and a CVD component of the deposition. For example, a cyclical CVD process may comprise the continuous flow of a one precursor and the periodic pulsing of a second precursor into the reaction chamber.

FIG. 3 illustrates a non-limiting exemplary process flow for the method 300 for selective bottom-up filling of one or more gap features on a surface of a substrate of a device structure (such as structure 100 of FIG. 1) with a molybdenum metal film according to the present description.

The method 300 may begin with step 310 that involves performing a surface clean on a semiconductor device structure to remove metal oxides from a metal film/layer/element on a bottom surface(s) or a base(s) of a gap feature(s). The metal film may be formed of or include a variety of metals including, but not limited to, titanium nitride (TiN), tungsten (W) (such as fluorine-free W (FFW)), ruthenium (Ru), cobalt (Co), and copper (Cu). Before depositing Mo on the metal surfaces of the device structure, it is typically useful to remove metal oxides on the substrate, and surface cleaning of step 310 may be performed, for example, using H2-based plasma cleaning techniques in a direct plasma or a remote plasma tool that are designed to remove metal oxides.

Once the metal oxides are removed, the method 300 may continue with step 320 involving providing the device structure (or substrate, wafer, or the like) into a reaction chamber designed for cyclical deposition and then heating the device structure to process temperature. The process temperature may be less than 450° C. such as in the range of 350 to 450° C. and with several working examples wafer temperatures being 415° C., 435° C., and 465° C. (as seen in the selective deposition results of FIG. 5). Next, steps 330, 340, and 350 may be performed to perform a cycle of a cyclical deposition process (such as ALD, CVD, or the like) to partially fill the gap feature with a Mo film on the metal film/layer on the base or bottom surface of the gap feature, and the cycle may be repeated as needed to provide a desired fill of a gap feature (e.g., a desired Mo layer or fill element thickness) as shown at decision gate 360.

The cycle in process 300 may be considered to have a sequence of a Mo pulse, purge with a reactant (e.g., a reducing agent such as H2) provided by continuous flow, but it will be understood that a more typical ALD or similar sequence as discussed for method 200 may be utilized in other embodiments. This sequence is shown in FIG. 3 with step 330 providing a molybdenum precursor into the reaction chamber for a pulse period. The molybdenum precursor may take a variety of forms with a molybdenum oxychloride including, but not limited to, molybdenum dichloride dioxide (MoO2Cl2) or a MoO2Cl2 precursor being useful in some implementations of method 300. The pulse may be carried out for a time period in the range of 0.05 to 10 seconds, with 0.2 seconds used in one embodiment. Step 340 involves purging the Mo from the reaction chamber, which may be carried out with flow of an inert gas for a purge period in the range of 1 to 30 seconds, with 5 seconds being used in one embodiment.

Concurrently with steps 330 and 340, the cycle includes step 350 involving providing a reactant to the reaction chamber with continuous flow. The reactant may take a variety of forms to implement the method 300 with a reducing agent such as H2 used in some implementations. Then, after each cycle at step 360, if the Mo film has not reached a desired thickness than additional cycles may be performed to further increase the thickness for the Mo film being grown to bottom-up fill the gap feature, with no or very limited deposition on the dielectric surfaces of the gap feature sidewalls (relevant oxide surface and low-k, TEOS, SiN, and other surfaces of the device structure). If further thickness is desired, an additional cycle is performed by repeating steps 330 to 350. If the desired film or fill element thickness is satisfied, the method 300 may end at 390.

The pressure and flow parameters may be in the ranges and/or have the values provided for method 200, with one implementation using a reactor pressure in the range of 10 to 100 Torr such as, but not limited to, 80 Torr. The process or wafer temperature may be in the range of 350 to 450° C., such as but not limited to the range of 400 to 450° C. with wafer temperatures of 415° C. and 435° C. being proven to be useful in working examples of method 300 (see FIG. 5).

Figure 4:
FIG. 4 is a graph providing deposition results for a molybdenum film on a metal base of a gap feature using the method of FIG. 2 showing achieved selectivity.
Figure 4:
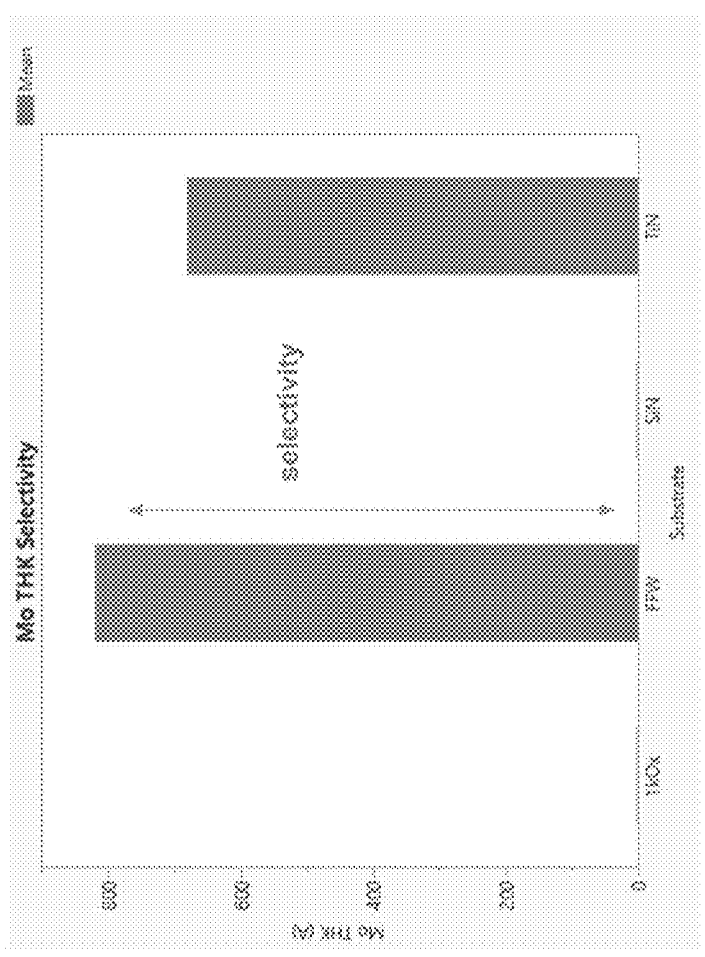

FIG. 4 is a graph 400 providing deposition results for using the selective bottom-up fill of a molybdenum film (or Mo) on a metal base (or MoM) of a gap feature using the method 200 of FIG. 2. Graph 400 is useful for showing achieved selectivity during the Mo MoM deposition, with Mo selectivity on FFW and TiN shown to be greater than 600 Å (such as about 800 and about 700 Å, respectively). In the same cycles, the Mo thickness was 0 Å on the dielectric surfaces (1kOx) as well as on SiN. The selectivity shown in graph 400 were obtained using process or wafer temperatures less than 500° C.

Figure 5:
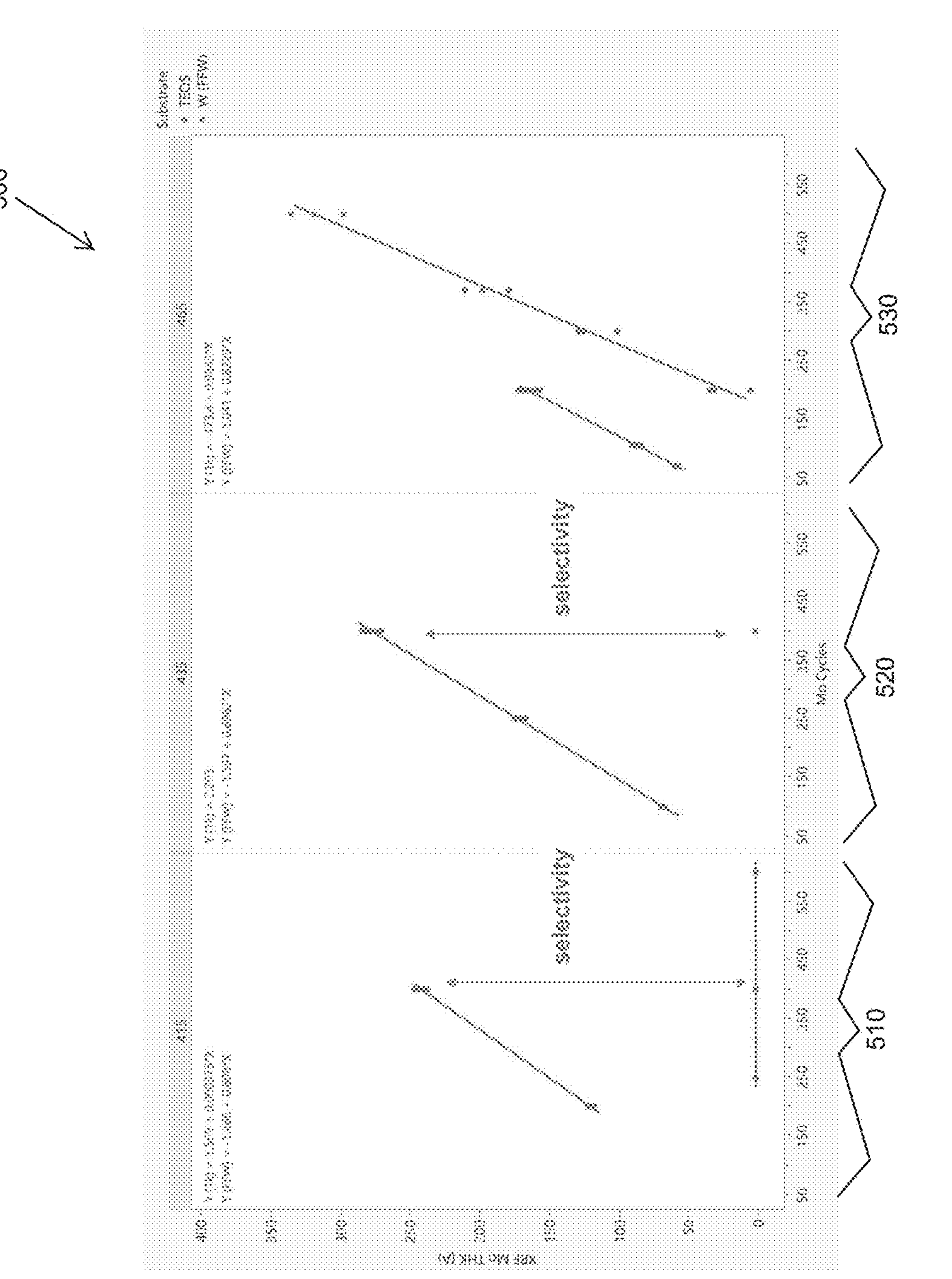
FIG. 5 is a graph providing deposition results for a molybdenum film on a metal base of a gap feature using the method of FIG. 3 showing achieved selectivity.

FIG. 5 is a graph 500 providing deposition results for a molybdenum film on a metal base of a gap feature using the method 300 of FIG. 3 showing achieved selectivity. The deposition is shown on tungsten (FFW) and on TEOS at three different process or wafer temperatures, i.e., 415, 435, and 465° C., with subgraphs 510, 520, and 530. As shown, the desired selectivity (e.g., greater than 50 Å up to 250 Å or more) on tungsten was maintained at the lower temperatures of 415° C. and 435° C. (with deposition occurring over about 100 to 400 cycles), while temperatures over 450° C., such as 465° C., resulted in deposition upon TEOS surfaces as well as upon the tungsten surfaces. Hence, deposition processes using MoO2Cl2 as a molybdenum precursor have been shown to provide desired selectivity for bottom-fill using Mo MoM of gap features at temperatures below 450° C., such as in the range of 350 to 450° C.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combination of the elements described, may become apparent to those skilled in the art from the description. Such modifications and embodiments are also intended to fall within the scope of the appended claims.

In some embodiments of the disclosure, the substrate may comprise a patterned substrate including high aspect ratio features, such as, for example, trench structures, vertical gaps, horizontal gaps, and/or fin structures. For example, the substrate may comprise one or more substantially vertical gap features and/or one or more substantially horizontal gap features. The term "gap feature" may refer to an opening or cavity disposed between opposing inclined sidewalls of two protrusions extending vertically from the surface of the substrate or opposing inclined sidewalls of an indentation extending vertically into the surface of the substrate, such a gap feature may be referred to as a "vertical gap feature." The term "gap feature" may also refer to an opening or cavity disposed between two opposing substantially horizontal surfaces, the horizontal surfaces bounding the horizontal opening or cavity; such a gap feature may be referred to as a "horizontal gap feature." It should be noted that the embodiments of the disclosure are not limited to filling vertical gap features and/or horizontal gap features and that other geometries of gap features disposed in and/or on a substrate may be filled with a molybdenum metal by the processes disclosed herein.

Patterned substrates may comprise substrates that may include semiconductor device structures formed into or onto a surface of the substrate, for example, a patterned substrate may include partially fabricated semiconductor device structures, such as, for example, transistors and/or memory elements. In some embodiments, the substrate may contain monocrystalline surfaces and/or one or more secondary surfaces that may include a non-monocrystalline surface, such as a polycrystalline surface and/or an amorphous surface. Monocrystalline surfaces may include, for example, one or more of silicon (Si), silicon germanium (SiGe), germanium tin (GeSn), or germanium (Ge). Polycrystalline or amorphous surfaces may include dielectric materials, such as oxides, oxynitrides, oxycarbides, oxycarbide nitrides, nitrides, or mixtures thereof.

In some embodiments of the disclosure, the molybdenum gap fill metal films formed according to the embodiments of the disclosure may include low electrical resistivity molybdenum metal films. For example, in some embodiments, the molybdenum metal films may have an electrical resistivity of less than 3000 μΩ-cm, or less than 1000 μΩ-cm, or less than 500 μΩ-cm, or less than 200 μΩ-cm, or less than 100 μΩ-cm, or less than 50 μΩ-cm, or less than 25 μΩ-cm, or less than 15 μΩ-cm, or even less than 10 μΩ-cm. As a non-limiting example, a molybdenum metal film may be utilized to fill one or more gap features to a thickness of approximately less than 100 Angstroms and the molybdenum metal film may exhibit an electrical resistivity of less than 35 μΩ-cm. As a further non-limiting example, a molybdenum metal film may be utilized to fill one or more gap features to a thickness of less than 200 Angstroms and the molybdenum metal film may exhibit an electrical resistivity of less than 25 μΩ-cm.

In some embodiments of the disclosure, the gap fill methods may further include forming a molybdenum metal film with a low atomic percentage (atomic-%) of impurities. For example, the molybdenum metal films of the current disclosure may include an impurity concentration of less than 5 atomic-%, or less than 2 atomic-%, or even less than 1 atomic-%. In some embodiments, the impurities disposed within the molybdenum metal film may include at least oxygen and chlorine.

In some embodiments of the disclosure, the gap fill molybdenum metal film may comprise a crystalline film. In some embodiments, the gap fill molybdenum metal film may comprise a polycrystalline film wherein the plurality of crystalline grains comprising the polycrystalline molybdenum metal film may have a grain size greater than 100 Angstroms.

What is claimed is:

1. A method for filling a gap feature on a substrate surface, comprising:

providing a substrate with a surface comprising a gap feature in a reaction chamber, wherein the gap feature includes a dielectric sidewall and a metal base;

partially filling the gap feature with a molybdenum film with a cyclical chemical vapor deposition (cyclical CVD) process, wherein the molybdenum film is selectively deposited on the metal base and wherein a cycle of the cyclical chemical vapor deposition process comprises:

providing a molybdenum precursor comprising one or more of $MoCl_5$ and $MoCl_4$ in the reaction chamber; and providing a reactant in the reaction chamber to form a layer of the molybdenum film; and repeating the partially filling the gap step until the molybdenum film has at least a predefined thickness.

2. The method of claim 1, wherein the metal base comprises a metal selected from the group consisting of tungsten (W), titanium nitride (TiN), ruthenium (Ru), cobalt (Co), and copper (Cu).

3. The method of claim 1, wherein the reactant is a reducing agent.

4. The method of claim 1, wherein a thickness of molybdenum grown on the dielectric surface is substantially 0 Å.

5. The method of claim 1, wherein the molybdenum precursor comprises $MoCl_4$.

6. The method of claim 1, wherein the molybdenum precursor is $MoCl_4$.

7. The method of claim 1, wherein the reactant is continuously provided during the cycle of the cyclical chemical vapor deposition process.

8. The method of claim 7, further comprising heating the substrate to a substrate temperature in the range of 350 to 450° C. and maintaining the reaction chamber at a pressure in the range of 10 to 100 Torr during the partially filling the gap step.

9. The method of claim 7, wherein the reactant consists of hydrogen ($H_2$).

10. The method of claim 1, wherein the predefined thickness is greater than 50 Å and wherein the molybdenum film selectively grows on the metal film relative to the dielectric sidewall for at least the predefined thickness.

11. The method of claim 1, wherein the predefined thickness is in the range of 20 to 600 Å and wherein the molybdenum film selectively grows on the metal film relative to the dielectric sidewall for at least the predefined thickness.

12. A method of bottom-up filling a gap feature on a surface of a substrate, comprising surface cleaning a substrate with a gap feature having sidewalls with dielectric surface and a bottom surface with a metal film to remove metal oxides from the metal film;

after the surface cleaning, providing the substrate in a reaction chamber;

heating the substrate to a substrate temperature greater than 350° C.;

contacting the substrate with a molybdenum precursor comprising one or more of $MoCl_5$ and $MoCl_4$ by periodically pulsing the molybdenum precursor;

contacting the substrate with a reducing agent, wherein contacting the substrate with the reducing agent comprises continuously providing the reducing agent during the step of contacting the substrate with the molybdenum precursor; and repeating the contacting steps until a molybdenum film is formed on the metal film on the bottom surface of the gap feature, wherein the molybdenum film is formed with a selectivity of at least 50:1 between the metal film and the dielectric surface.

13. The method of claim 12, wherein the molybdenum film has a thickness of at least 200 Å.

14. The method of claim 12, wherein the metal film comprises a metal selected from the group consisting of W, TiN, Ru, Co, and Cu.

15. The method of claim 12, wherein the molybdenum precursor comprises $MoCl_5$ and wherein the substrate temperature is in the range of 350 to 550° C.

16. The method of claim 12, wherein the molybdenum precursor comprises $MoCl_4$.

17. A method for selectively depositing a molybdenum film on a semiconductor device structure, comprising:

providing a device structure in a reaction chamber, wherein the device structure comprises a substrate including a dielectric surface and a metal surface;

partially forming a molybdenum film selectively on the metal surface with a cyclical chemical vapor deposition (cyclical CVD) process, wherein a unit cycle of the cyclical chemical vapor deposition process comprises:

providing a molybdenum precursor in the reaction chamber;

purging the molybdenum precursor from the reaction chamber; and providing a reactant in the reaction chamber, wherein the reactant comprises a reducing agent;

repeating the partially forming the molybdenum film step until the molybdenum film has a thickness greater than 200 Å and wherein a thickness of molybdenum grown on the dielectric surface is substantially 0 Å.

18. The method of claim 17, wherein the metal surface comprises a metal selected from the group consisting of W, TiN, Ru, Co, and Cu and wherein the molybdenum precursor is selected from the group consisting of $MoCl_5$, $MoCl_4$, $MoO_2Cl_2$, and $MoOCl_4$.

19. The method of claim 18, wherein the method further comprises, prior to the partially forming the molybdenum film step, heating the substrate to a substrate temperature in the range of 350 to 550° C. when the molybdenum precursor comprises $MoCl_5$ or $MoCl_4$ and in the range of 350 to 450° C. when the molybdenum precursor comprises $MoO_2Cl_2$ or $MoOCl_4$.

* * * * *